(12) United States Patent
Kim

(10) Patent No.: US 7,358,575 B2
(45) Date of Patent: Apr. 15, 2008

(54) METHOD OF FABRICATING SRAM DEVICE

(75) Inventor: Tae Woo Kim, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/603,886

(22) Filed: Nov. 21, 2006

(65) Prior Publication Data

US 2007/0063356 A1    Mar. 22, 2007

Related U.S. Application Data

(62) Division of application No. 11/027,826, filed on Dec. 29, 2004, now Pat. No. 7,157,318.

(30) Foreign Application Priority Data

Dec. 31, 2003   (KR)  .................... 10-2003-0101539

(51) Int. Cl.
    *H01L 29/76*     (2006.01)
    *H01L 29/94*     (2006.01)
    *H01L 31/062*     (2006.01)
    *H01L 31/113*     (2006.01)
    *H01L 31/119*     (2006.01)

(52) U.S. Cl. ................ 257/393; 257/903; 257/E27.098; 257/E27.097

(58) Field of Classification Search ........ 257/393–400, 257/903–904, E27.97, E27.098
See application file for complete search history.

(56) References Cited

U.S. PATENT DOCUMENTS

| | | | |
|---|---|---|---|
| 6,743,717 B1 | 6/2004 | Wu et al. | |
| 6,770,522 B2 * | 8/2004 | Okumura et al. | ........... 438/199 |
| 2002/0113295 A1 | 8/2002 | Nakamura | |
| 2004/0185671 A1 | 9/2004 | Lee | |

* cited by examiner

*Primary Examiner*—Cuong Nguyen
(74) *Attorney, Agent, or Firm*—Andrew D. Fortney

(57) ABSTRACT

A method of fabricating an SRAM device is provided, by which a junction node area is stably secured in a 1T type SRAM device. The method includes forming first and second conductor patterns on a cell area of a semiconductor substrate and a third conductor pattern on a periphery area of the semiconductor substrate, stacking first to third insulating layers over the substrate, forming a spacer on a sidewall of the third conductor pattern in the exposed periphery area, removing the third insulating layer, and forming first and second spacers on sidewalls of the first and second conductor patterns.

10 Claims, 4 Drawing Sheets

METHOD OF FABRICATING SRAM DEVICE

This application is a divisional of U.S. application Ser. No. 11/027,826, filed on Dec. 29, 2004 now U.S. Pat. No. 7,157,318. This application also claims the benefit of the Korean Application No. P2003-0101539 filed on Dec. 31, 2003, which is hereby incorporated by reference.

BACKGROUND OF THE INVENTION

1. Field of the Invention

The present invention relates to a method of fabricating an SRAM device, by which a junction node area is stably secured in an 1T type SRAM device.

2. Discussion of the Related Art

Lately, the 1T type SRAM (static random access memory) device configured with one capacitor and one transistor has been proposed to meet the demand for high integration and performance enhancement of an SRAM device. One of the conditions for stable implementation of the 1T type SRAM device is to stably secure an electrical characteristic of an area between a transistor and a capacitor, i.e., a junction node.

FIGS. 1A to 1C are cross-sectional diagrams for explaining a method of fabricating an SRAM device according to a related art.

Referring to FIG. 1A, a device isolation layer 102 is formed on a semiconductor substrate 101 to define an active area. In doing so, the active area is divided into a cell area and a periphery area.

An oxide layer and a conductor layer are sequentially stacked on the substrate 101. And, the conductor and oxide layers are selectively patterned. Hence, a gate insulating layer 103a, a gate electrode pattern 104a, a dielectric layer 103b of a capacitor, and an upper electrode pattern 104 of the capacitor are formed in the cell area, while a gate insulating layer 103c and a gate electrode pattern 104c are formed in the periphery area.

Subsequently, LDD ion implantation is carried out on the substrate 201 to form lightly doped regions n⁻ in the active areas to be aligned with the gate electrode patterns, respectively.

Referring to FIG. 1B, a first insulating layer 105 and a second insulating layer 106 are sequentially stacked on the substrate 201 including the gate electrode patterns and the upper electrode pattern. In doing so, a total thickness of the first and second insulating layers 105 and 106 is about 1,000 Å.

Referring to FIG. 1C, the second and first insulating layers 106 and 105 are anisotropically etched to form spacers on sidewalls of the gate electrode patterns and the upper electrode pattern, respectively in the cell and periphery areas.

Subsequently, source/drain ion implantation is carried out on the substrate 101 to form heavily doped regions n+ in the active areas of the substrate 101 to be aligned with the spacers, respectively.

However, in the cell area of the related art 1T type SRAM device, a gap between the spacers on the sidewalls of the gate electrode and the upper electrode is so narrow that an interval, i.e., a conjunction node, between the source/drain regions cannot be sufficiently provided.

If a width of the junction node is tight, capacitance of the capacitor is lowered. In such a manner, if the capacitor performance is lowered, device reliability and throughput are degraded.

SUMMARY OF THE INVENTION

Accordingly, the present invention is directed to a method of fabricating an SRAM device that substantially obviates one or more problems due to limitations and disadvantages of the related art.

An object of the present invention is to provide a method of fabricating an SRAM device, by which a junction node area is stably secured in an 1T type SRAM device.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating an SRAM device according to the present invention includes the steps of forming first and second conductor patterns on a cell area of a semiconductor substrate and a third conductor pattern on a periphery area of the semiconductor substrate, stacking first to third insulating layers over the substrate, forming a first mask over the substrate to expose the periphery area of the substrate, forming a third spacer on a sidewall of the third conductor pattern by etching back the third to first insulating layers in the exposed periphery area, removing the first mask, removing the third insulating layer, forming a second mask over the substrate to expose the cell area of the substrate, forming first and second spacers on sidewalls of the first and second conductor patterns, respectively by etching back the second and first insulating layers in the exposed cell area, and removing the second mask.

Preferably, the first to third insulating layers have respective thicknesses of 150~250 Å, 450~550 Å, and 250~350 Å.

Preferably, the first and second conductor patterns comprise a gate electrode of a transistor and an upper electrode of a capacitor, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2D are cross-sectional diagrams for explaining a method of fabricating an SRAM device according to the present invention.

Figure 1A:
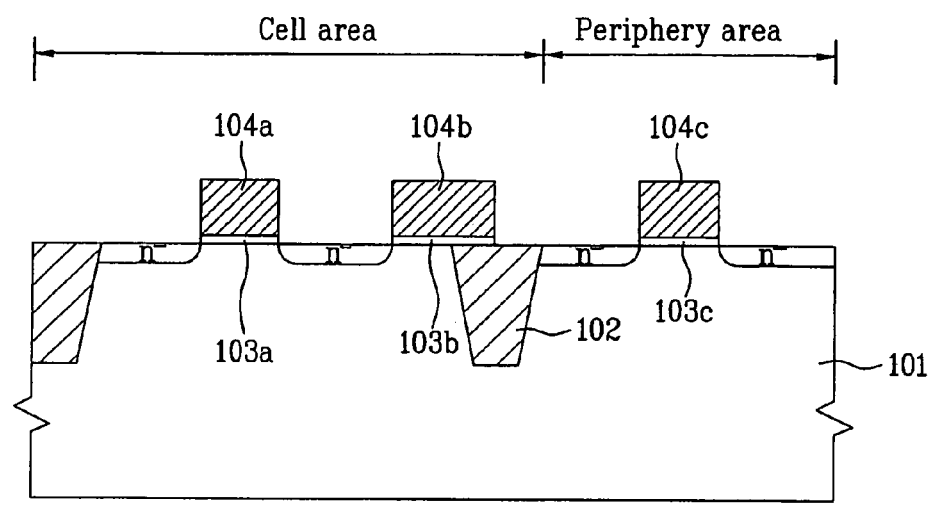
FIGS. 1A to 1C are cross-sectional diagrams for explaining a method of fabricating an SRAM device according to a related art.
Figure 1B:
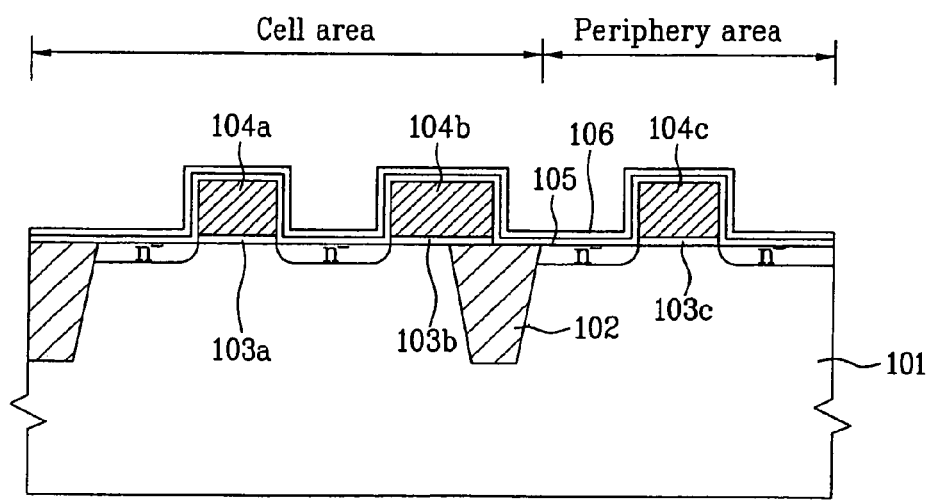
Figure 1C:
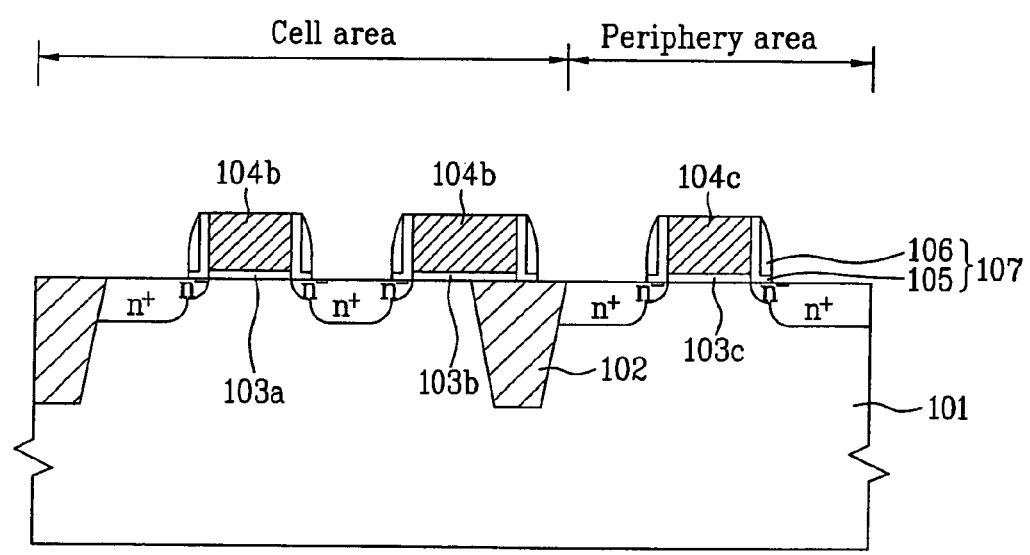
Figure 2A:
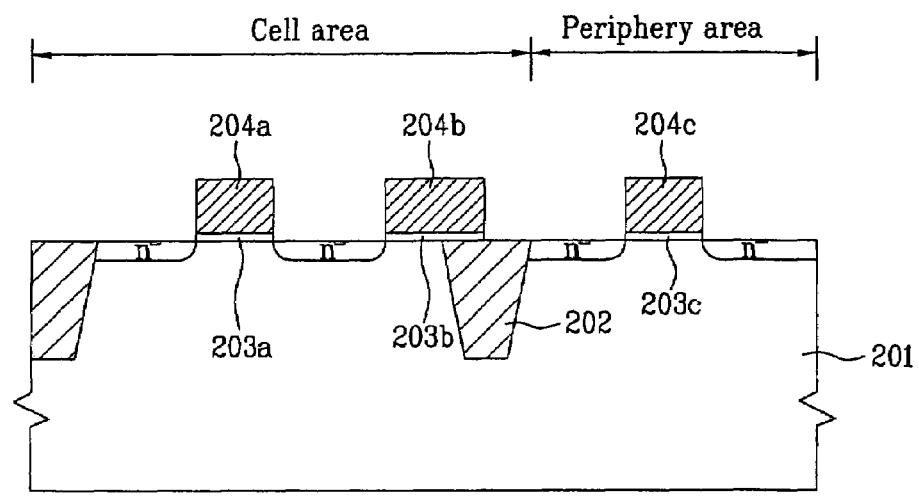
FIGS. 2A to 2D are cross-sectional diagrams for explaining a method of fabricating an SRAM device according to the present invention.

Referring to FIG. 2A, a device isolation layer 202 is formed on a field area of a semiconductor substrate 201 by STI (shallow trench isolation or the like to define an active area of the semiconductor substrate 201. In this case, a first conductive type (n- or p-type) single crystalline silicon substrate may be used as the semiconductor substrate 201. In doing so, the semiconductor substrate 201 is divided into a cell area and a periphery area.

An oxide layer is formed on the active areas of the semiconductor substrate 201 by thermal oxidation or the like. Optionally, ion implantation for threshold voltage adjustment can be further performed on the substrate to provide a dopant profile beneath a surface of the substrate 201.

Subsequently, a conductor layer such as a polysilicon layer is deposited on the oxide layer.

Photoresist is coated on the conductor layer. And, exposure and development are carried out on the photoresist to form a photoresist pattern (not shown in the drawing). In doing so, the photoresist pattern covers a first gate forming area and an upper electrode forming area in the cell area and a second gate forming area in the periphery area.

The conductor and oxide layers are etched to expose the substrate 201 using the photoresist pattern as an etch mask. Hence, a first conductor pattern 204a and a second conductor pattern 204 are formed in the cell area and a third conductor pattern 204c is formed in the periphery area. In this case, the first and second conductor patterns 204a and 204b may be a gate electrode and an upper electrode, respectively. And, the third conductor pattern 204c may be either a gate electrode or an upper electrode.

Thus, the second conductor pattern 204b, the oxide (dielectric) layer 203b, and the substrate 201 as a lower electrode can configure a capacitor.

Second conductive type LDD ion implantation is carried out on the substrate 201 to form lightly doped regions n⁻ in the active areas of the substrate. In doing so, the lightly doped regions n⁻ are aligned with the first to third conductor patterns 204a to 204c, respectively. And, the lightly doped regions n⁻ are activated by performing rapid thermal processing or the like on the substrate 201.

Figure 2B:
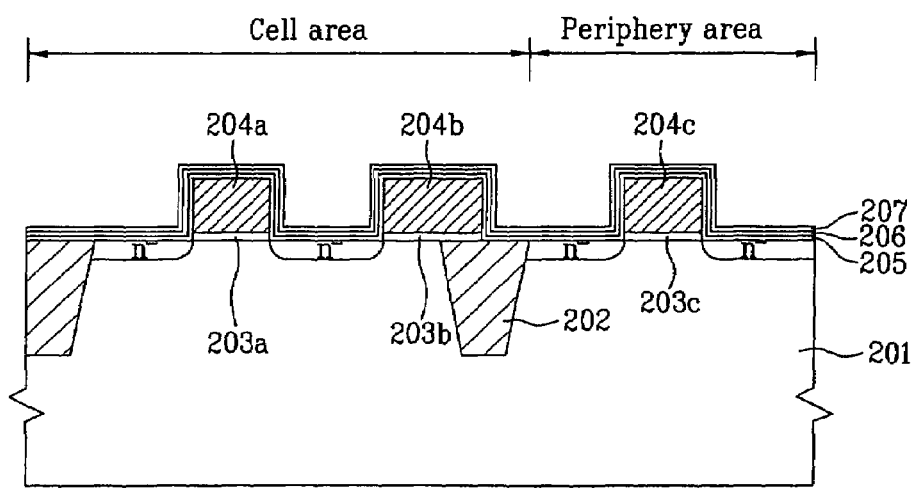

Referring to FIG. 2B, first to third insulating layers 205 to 207 are sequentially stacked on the substrate 201 including the first to third conductor patterns 204a to 204c. Preferably, the first to third insulating layers 205 to 207 have respective thicknesses of about 150~250 Å, 450~550 Å, and 250~350 Å. Preferably, the first and third insulating layers 205 and 207 comprise oxide (e.g., silicon dioxide), while the second insulating layer 206 comprises nitride (e.g., silicon nitride).

Figure 2C:
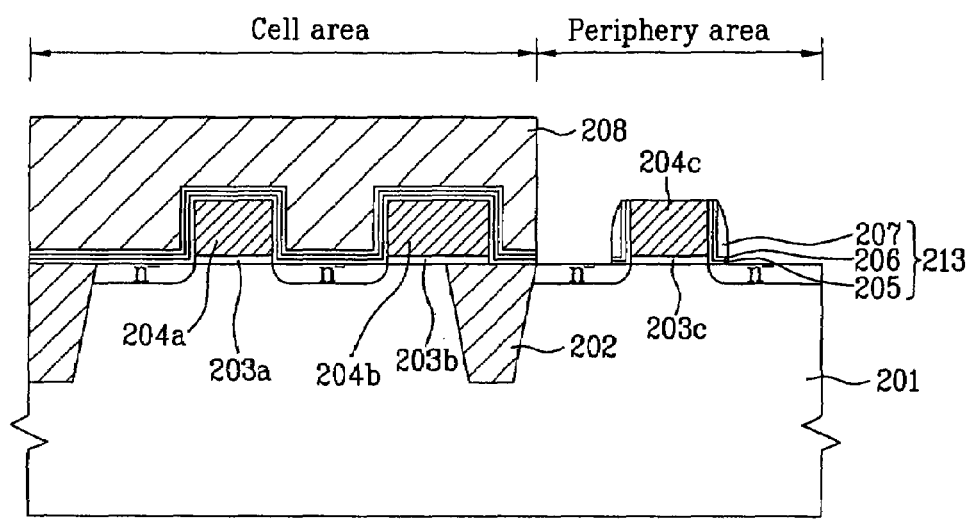

Referring to FIG. 2C, photoresist is coated on the third insulating layer 207. Exposure and development are carried out on the photoresist to form a first photoresist pattern 208 exposing the periphery area of the substrate 201 only.

The third to first insulating layers 207 to 205 are etched back by RIE (reactive ion etch) having an anisotropic etch tendency until surfaces of the third conductor pattern 204c and the substrate 201 are exposed. Hence, a third spacer 213 is provided to a sidewall of the third conductor pattern 204c.

Figure 2D:
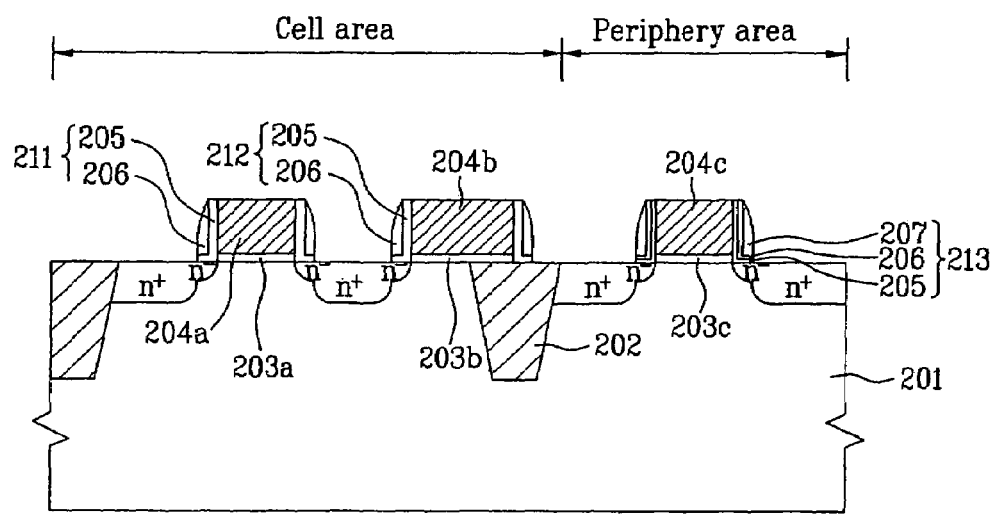

Referring to FIG. 2D, after the first photoresist pattern has been removed, the third insulating layer 207 remaining in the cell area is removed by wet etch.

Subsequently, photoresist is coated over the substrate 201. Exposure and development are carried out on the photoresist to form a second photoresist pattern (not shown in the drawing) exposing the cell area of the substrate 201 only. Alternatively, to ensure that the third insulating layer 207 in the periphery area is not removed by wet etching, the second photoresist pattern can be formed after removing the first photoresist pattern, but before wet etching the third insulating layer 207 in the cell area.

The second and first insulating layers 206 and 205 in the exposed cell area are then etched back (generally anisotropically) to form first and second spacers 211 and 212 on sidewalls of the first and second conductor patterns 203a and 204b, respectively.

Namely, each of the first and second spacers 211 and 212 includes the remaining first and second insulating layers 205 and 206, whereas the third spacer 213 includes the remaining first to third insulating layers 205 to 207.

Hence, a gap between the first and second conductor patterns 204a and 204b, i.e., a width of a junction node, can be sufficiently provided.

After the second photoresist pattern has been removed, source/drain ion implantation is carried out on the substrate 201 to form heavily doped regions n⁺ in the active areas of the substrate 201 to be aligned with the first to third spacers 211 to 213, respectively.

Finally, salicidation is carried out on the substrate to form a salicide layer (not shown in the drawing) on exposed surfaces of the first to third conductor patterns 204a to 204c and the heavily doped regions n⁺.

Accordingly, in the present invention, a width of the spacer of the gate or upper electrode in the cell area is formed smaller than that of the gate electrode in the periphery area, whereby the junction node between the capacitor and transistor in the cell area can be stably secured.

Therefore, the present invention stably sustains capacitance of the capacitor, thereby enhancing device reliability and throughput.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An SRAM device, comprising:
   first and second conductor patterns on a cell area of a semiconductor substrate and a third conductor pattern on a periphery area of the semiconductor substrate;
   first and second spacers, each comprising at least two insulating layers, on sidewalls of the first and second conductor patterns; and
   a third spacer, comprising at least three insulating layers including said at least two insulating layers, on a sidewall of the third conductor pattern,
   wherein both of the first and second spacers have at least one less insulating layer than the third spacer.

2. The device of claim 1, wherein the first insulating layer has a thickness of 150~250 Å.

3. The device of claim 1, wherein the second insulating layer has a thickness of 450~550 Å.

4. The device of claim 1, wherein the third insulating layer has a thickness of 250~350 Å.

5. The device of claim 1, wherein the first conductor pattern comprises a gate electrode of a transistor.

6. The device of claim 1, wherein the second conductor pattern comprises an upper electrode of a capacitor.

7. The device of claim 1, wherein the first and third insulating layers comprise an oxide.

8. The device of claim 1, wherein the second insulating layer comprises a nitride.

9. The device of claim 1, further comprising LDD ion implant regions in active areas of the substrate, aligned with the first, second and third conductor patterns.

10. The device of claim 1, further comprising source/drain ion implant regions in active areas of the substrate, aligned with the first, second and third spacers.

* * * * *